US008836138B2

(12) United States Patent
Fujii

(10) Patent No.: US 8,836,138 B2
(45) Date of Patent: Sep. 16, 2014

(54) WIRING SUBSTRATE AND SEMICONDUCTOR PACKAGE

(75) Inventor: Tomoharu Fujii, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 0 days.

(21) Appl. No.: 13/592,547

(22) Filed: Aug. 23, 2012

(65) Prior Publication Data

US 2013/0062778 A1    Mar. 14, 2013

(30) Foreign Application Priority Data

Sep. 9, 2011    (JP) .................................. 2011-197644

(51) Int. Cl.

| H01L 29/40 | (2006.01) |
| H01L 23/498 | (2006.01) |
| H01L 23/50 | (2006.01) |
| H05K 1/02 | (2006.01) |
| H05K 3/46 | (2006.01) |
| H05K 1/16 | (2006.01) |

(52) U.S. Cl.
CPC ....... H01L 23/50 (2013.01); *H01L 2224/16237* (2013.01); *H05K 2201/09336* (2013.01); *H05K 1/0222* (2013.01); H01L 23/49827 (2013.01); *H01L 2924/15311* (2013.01); *H01L 2224/13116* (2013.01); H05K 1/0251 (2013.01); H05K 3/4605 (2013.01); *H01L 2224/13111* (2013.01); *H05K 1/162* (2013.01)

USPC ............ 257/774; 257/773; 361/303; 361/330

(58) Field of Classification Search
CPC ........ H01L 23/50; H01L 23/48; H01L 23/522
USPC ........................... 257/773, 774; 361/303, 330
See application file for complete search history.

(56) References Cited

U.S. PATENT DOCUMENTS

| 2003/0111709 A1* | 6/2003 | Lin et al. ....................... 257/532 |
| 2009/0067116 A1* | 3/2009 | Fujii et al. ..................... 361/303 |
| 2010/0061036 A1* | 3/2010 | Harris et al. .................. 361/303 |

FOREIGN PATENT DOCUMENTS

JP    2006-019431    1/2006

\* cited by examiner

*Primary Examiner* — Kyoung Lee
*Assistant Examiner* — Ratisha Mehta
(74) *Attorney, Agent, or Firm* — Rankin, Hill & Clark LLP

(57) ABSTRACT

A wiring substrate includes: a substrate body made of an inorganic material; a first electrode portion, having a flat-plate shape, which penetrates through the substrate body in a thickness direction of the substrate body; a second electrode portion, having a flat-plate shape, which penetrates through the substrate body in the thickness direction and faces the first electrode portion at a prescribed interval; and a first signal electrode, which is provided between the first electrode portion and the second electrode portion and penetrates through the substrate body in the thickness direction, wherein one of the first electrode portion and the second electrode portion is a ground electrode and the other is a power electrode.

5 Claims, 13 Drawing Sheets

WIRING SUBSTRATE AND SEMICONDUCTOR PACKAGE

BACKGROUND

1. Field of the Invention

The present invention relates to a wiring substrate made of an inorganic material and a semiconductor package in which a semiconductor chip is mounted on the wiring substrate.

2. Description of the Related Art

Wiring substrates made of organic materials such as insulative resins and wiring substrates made of inorganic materials such as silicon are known. In wiring substrates made of organic materials, a planar power plane and ground (GND) plane are formed to attain impedance matching, reduction of power source impedance, etc., as disclosed in JP-A-2006-019431.

The resistance of a power pattern or a ground pattern can be made low by making the area of a power plane or a GND plane as wide as possible. When opposed to each other at a small interval, a power plane and a GND plane can be made more capacitive than inductive. Furthermore, impedance matching can be attained by interposing a signal electrode between a power plane and a GND plane.

On the other hand, in wiring substrates made of inorganic materials, because of a microloading effect etc., it is difficult to form a planar power plane or GND plane. Therefore, a power line and a GND line are each formed merely by very fine wiring patterns and a via line.

Besides, the microloading effect is a phenomenon that the etching rate varies depending on the aspect ratio (i.e., the ratio between the width and the depth) of a pattern.

However, if a power line and a GND line are each formed merely by very fine wiring patterns and a via line in a wiring substrate made of an inorganic material, layers having wide conductor areas cannot be secured, as a result of which the power line and the GND line are made large in resistance and become more capacitive than inductive. As a result, power source impedance is made high. Furthermore, impedance matching with a line for high-speed input/output signals cannot be attained.

Even if the structure disclosed in JP-A-2006-019431 is employed, it is not easy to attain low power source impedance or impedance matching.

SUMMARY

The present invention has been made in view of the above, and an object of the invention is therefore to provide a wiring substrate which can attain low power source impedance and impedance matching easily though made of an inorganic material, as well as a semiconductor package in which a semiconductor chip is mounted on such a wiring substrate.

A wiring substrate according to the invention includes: a substrate body made of an inorganic material; a first electrode portion, having a flat-plate shape, which penetrates through the substrate body in a thickness direction of the substrate body; a second electrode portion, having a flat-plate shape, which penetrates through the substrate body in the thickness direction and faces the first electrode portion at a prescribed interval; and a first signal electrode, which is provided between the first electrode portion and the second electrode portion and penetrates through the substrate body in the thickness direction, wherein one of the first electrode portion and the second electrode portion is a ground electrode and the other is a power electrode.

The above-disclosed technique makes it possible to provide a wiring substrate which can attain low power source impedance and impedance matching easily though made of an inorganic material, as well as a semiconductor package in which a semiconductor chip is mounted on such a wiring substrate.

BRIEF DESCRIPTION OF THE DRAWINGS

The present invention will become more fully understood from the detailed description given hereinbelow and the accompanying drawing which is given by way of illustration only, and thus is not limitative of the present invention and wherein.

DETAILED DESCRIPTION OF THE INVENTION

Figure 1:
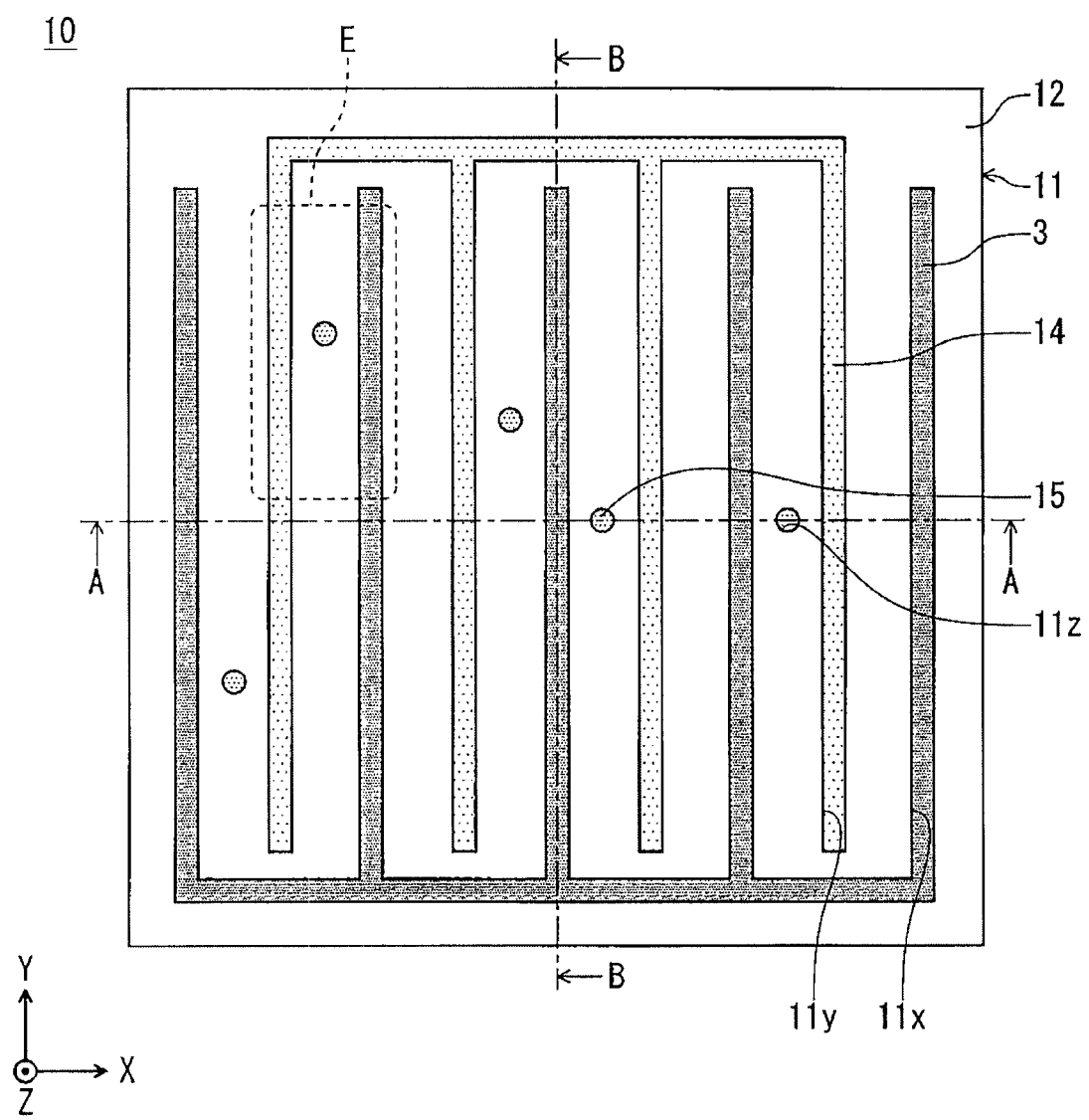
FIG. 1 is a plan view of a wiring substrate according to an embodiment.

Modes for carrying out the invention will be hereinafter described with reference to the drawings. The same constituent elements are given the same reference symbol in the drawings, and may not be described redundantly.

Figure 2:
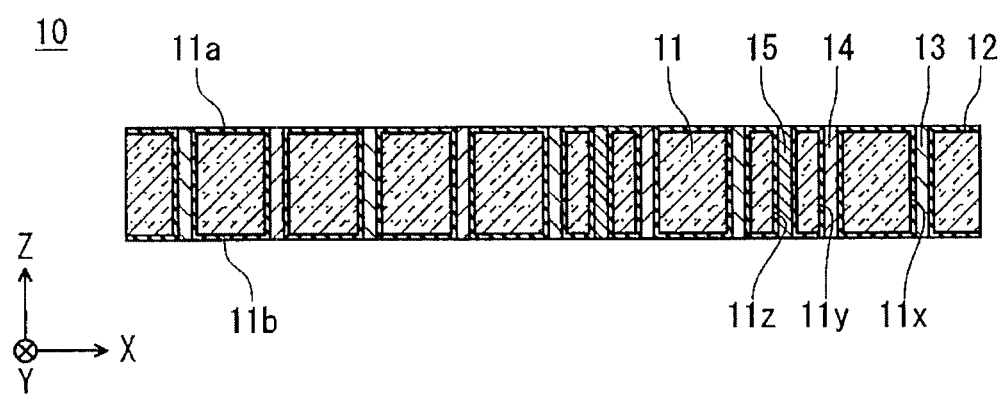
FIG. 2 is a sectional view taken along line A-A in FIG. 1.
Figure 3:
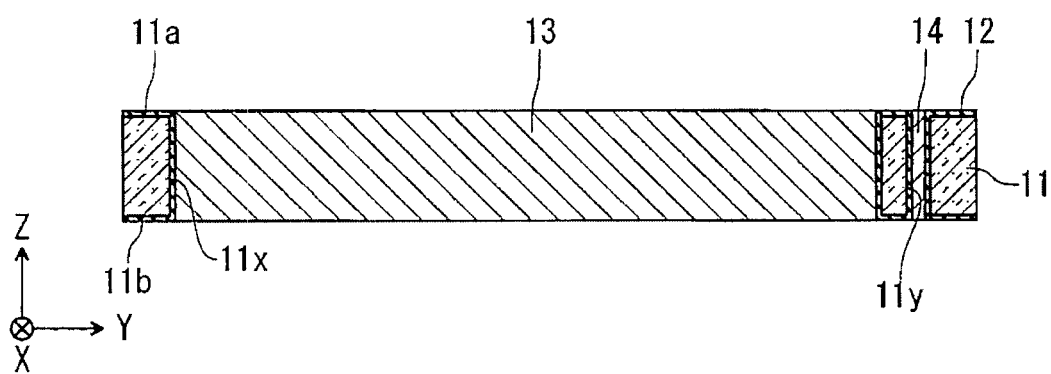
FIG. 3 is a sectional view taken along line B-B in FIG. 1.

First, the configuration of a wiring substrate 10 according to an embodiment will be described. FIG. 1 is a plan view of the wiring substrate 10 according to the embodiment. FIGS. 2 and 3 are sectional views taken along line A-A and line B-B in FIG. 1, respectively.

As shown in FIGS. 1-3, the wiring substrate 10 has a substrate body 11, an insulating film 12, aground (GND) electrode 13 (first electrode), a power electrode 14 (second electrode), and signal electrodes 15. Although the shape of the wiring substrate 10 is arbitrary, the embodiment will be directed to a case that the wiring substrate 10 has a plate-like shape that is square in a plan view. The X direction is defined as the direction of two confronting sides of the square top surface of the wiring substrate 10, and the Y direction is defined as the direction that is perpendicular to the X direction in the square top surface. The Z direction is defined as the thickness direction of the wiring substrate 10.

In the wiring substrate 10, through-holes $11x$, $11y$, and $11z$ are formed through the substrate body 11 which is a base member in which the GND electrode 13 etc. are formed. For example, the substrate body 11 measures 2 to 3 mm in each of the X direction and the Y direction and about 200 to 300 μm in the thickness direction (Z direction). For example, the material of the substrate body 11 is an inorganic material such as silicon, glass, or ceramics.

A semiconductor package can be formed by mounting a semiconductor chip on the wiring substrate 10. In this case, since in many cases the semiconductor chip has a silicon substrate, for matching between thermal expansion coefficients, it is preferable to use, as the material of the substrate body 11, silicon or borosilicate glass which is close to silicon in the thermal expansion coefficient. Borosilicate glass is glass whose main components are boron oxide ($B_2O_3$) and silica ($SiO_2$), and has a thermal expansion coefficient of about 3 ppm/° C.

The reason why the thermal expansion coefficient of the substrate body 11 needs to be matched with that of the semiconductor chip is to reduce thermal stress that may occur in the joining portions of the wiring substrate 10 and the semiconductor chip in view of the probability that the semiconductor chip may be caused to operate in a high-temperature or low-temperature atmosphere. The following description will be directed to a case that the substrate body 11 is made of silicon.

The through-holes 11x, 11y, and 11z penetrate through the substrate body 11 from its one surface 11a to the other surface lib. The through-hole 11x is formed for formation of the GND electrode 13 so as to extend in the thickness direction (Z direction) of the substrate body 11.

More specifically, plural (in the example of FIGS. 1-3, five) long, rectangular-parallelepiped-shaped through-holes are arranged in the X direction so as to extend approximately parallel with the two confronting surfaces (i.e., the side surfaces parallel with the YZ plane) of the substrate body 11. These through-holes correspond to comb tooth portions (described later). One long, rectangular-parallelepiped-shaped through-hole extends parallel with the other two confronting side surfaces (i.e., the side surfaces parallel with the ZX plane) of the substrate body 11 so as to connect the through-holes arranged in the X direction. These six through-holes which communicate with each other form a comb shape as a whole in a plan view. For example, the width of the through-hole 11x is several tens to several hundreds of micrometers.

The through-hole 11y is formed for formation of the power electrode 14 so as to extend in the thickness direction (Z direction) of the substrate body 11. More specifically, plural (in the example of FIGS. 1-3, four) long, rectangular-parallelepiped-shaped through-holes are arranged in the X direction so as to extend approximately parallel with the two confronting surfaces (i.e., the side surfaces parallel with the YZ plane) of the substrate body 11. These through-holes correspond to comb tooth portions (described later). One long, rectangular-parallelepiped-shaped through-hole extends parallel with the other two confronting side surfaces (i.e., the side surfaces parallel with the ZX plane) of the substrate body 11 so as to connect the through-holes arranged in the X direction. These five through-holes which communicate with each other form a comb shape as a whole in a plan view. For example, the width of the through-hole 11y is several tens to several hundreds of micrometers.

The portions of the through-hole 11x which is comb-shaped in a plan view and the portions of the through-hole 11y which is also comb-shaped in a plan view are arranged alternately in the substrate body 11 with portions of the insulating film 12 interposed between them. For example, the interval between adjoining ones of the portions of the through-hole 11x and the portions of the through-hole 11y is set at several tens to several hundreds of micrometers.

The through-holes 11z are formed for formation of the signal electrodes 15 so as to extend in the thickness direction (Z direction) of the substrate body 11. For example, the through-holes 11z are circular in a plan view, in which case their diameter is set at about 50 to 100 μm, for example. Each through-hole 11z is formed at such a position as to be interposed between through-holes 11x and 11y. Alternatively, the through-holes 11z may be rectangular, for example, in a plan view.

The insulating film 12 is formed on the surfaces 11a and lib of the substrate body 11 and the inner side surfaces of the through-holes 11x, 11y, and 11z. The insulating film 12 insulates the substrate body 11 from the GND electrode 13, the power electrode 14, and the signal electrodes 15. For example, the material of the insulating film 12 is silicon dioxide ($SiO_2$), silicon nitride (SiN), or polyimide (PI). For example, the thickness of the insulating film 12 is set at about 1 to 2 μm.

Although in the embodiment the insulating film 12 is used because the substrate body 11 is made of silicon which is a semiconductor material, the insulating film 12 may be omitted if the substrate body 11 is made of an insulative material such as glass or ceramics.

The GND electrode 13 is formed so that the through-hole 11x (whose inner side surfaces are covered with the insulating film 12) is filled with it. The GND electrode 13 is an electrode that is comb-shaped in a plan view and that is formed by connecting plural flat-plate-like comb tooth portions that penetrate through the substrate body 11 in its thickness direction with the major surfaces of the comb tooth portions perpendicular to the thickness direction of the substrate body 11. The flat-plate-like comb tooth portions are what is called GND planes. The term "major surface" means a widest planar surface of a flat-plate-like member. The GND electrode 13 is to be electrically connected to the ground (GND) of a semiconductor chip or the like. The GND electrode 13 is to be electrically connected to the ground (GND) of a semiconductor chip or the like.

The surface, exposed on the side of the one surface 11a of the substrate body 11, of the GND electrode 13 is approximately flush with the surface of that portion of the insulating film 12 which covers the surface 11a. The surface, exposed on the side of the other surface 11b of the substrate body 11, of the GND electrode 13 is approximately flush with the surface of that portion of the insulating film 12 which covers the surface 11b.

For example, the material of the GND electrode 13 is a metal material containing copper (Cu) as the main component. For example, the width of the GND electrode 13 is set at several tens to several hundreds of micrometers so as to be equal to the width of the through-hole 11x.

The power electrode 14 is formed so that the through-hole 11y (whose inner side surfaces are covered with the insulating film 12) is filled with it. The power electrode 14 is an electrode that is comb-shaped in a plan view and that is formed by connecting plural flat-plate-like comb tooth portions that penetrate through the substrate body 11 in its thickness direction with the major surfaces of the comb tooth portions perpendicular to the thickness direction of the substrate body 11. The flat-plate-like comb tooth portions are what is called power planes. The power electrode 14 is to be electrically connected to a power line of a semiconductor chip or the like.

The surface, exposed on the side of the one surface 11a of the substrate body 11, of the power electrode 14 is approximately flush with the surface of that portion of the insulating film 12 which covers the surface 11a. The surface, exposed on the side of the other surface 11b of the substrate body 11, of the power electrode 14 is approximately flush with the surface of that portion of the insulating film 12 which covers the surface 11b.

For example, the material of the power electrode 14 is a metal material containing copper (Cu) as the main component. For example, the width of the power electrode 14 is set at several tens to several hundreds of micrometers so as to be equal to the width of the through-hole 11y.

The portions of the GND electrode 13 which is comb-shaped in a plan view and the portions of the power electrode 14 which is also comb-shaped in a plan view are arranged alternately in the substrate body 11 with portions of the insulating film 12 interposed between them. For example, the interval between adjoining ones of the portions of the GND electrode 13 and the portions of the power electrode 14 is set at several tens to several hundreds of micrometers.

The signal electrodes 15 are formed so that the through-holes 11z (whose inner side surfaces are covered with the insulating film 12) are filled with them. The signal electrodes 15 are to be electrically connected to signal electrodes of a semiconductor chip or the like. The surfaces, exposed on the side of the surface 11a of the substrate body 11, of the respective signal electrodes 15 are approximately flush with the surface of that portion of the insulating film 12 which covers the surface 11a. The surfaces, exposed on the side of the surface 11b of the substrate body 11, of the respective signal electrodes 15 are approximately flush with the surface of that portion of the insulating film 12 which covers the surface 11b.

For example, the material of the signal electrodes 15 is a metal material containing copper (Cu) as the main component. For example, like the through-holes 11z, the signal electrodes 15 are circular in a plan view, in which case their diameter is set at about 50 to 100 μm, for example.

As seen from, for example, a region E shown in FIG. 1, each signal electrode 15 is interposed between confronting portions of the GND electrode 13 and the power electrode 14. Since each signal electrode 15 is interposed between flat-plate-like portions of the GND electrode 13 and the power electrode 14, a transmission line having what is called a strip line structure is realized and hence impedance matching can be attained (e.g., impedance of 50Ω can be realized).

As described above, the wiring substrate 10 according to the embodiment has the GND electrode 13 which is comb-shaped in a plan view as a result of connection of the flat-plate-like comb tooth portions which penetrate through the substrate body 11 in its thickness direction with the major surfaces of the comb tooth portions perpendicular to the thickness direction of the substrate body 11 and the power electrode 14 which is comb-shaped in a plan view as a result of connection of the flat plate-like comb tooth portions which penetrate through the substrate body 11 in its thickness direction with the major surfaces of the comb tooth portions perpendicular to the thickness direction of the substrate body 11. The comb tooth portions of the GND electrode 13 and those of the power electrode 14 are arranged alternately. Each signal electrode 15 which is formed so as to extend in the thickness direction of the substrate body 11 is disposed at such a position as to be interposed between confronting comb tooth portions of the GND electrode 13 and the power electrode 14. The positions of the GND electrode 13 and the power electrode 14 maybe interchanged. The number of comb tooth portions of the GND electrode 13 and the number of comb tooth portions of the power electrode 14 may be determined as appropriate.

[Manufacturing Method of Wiring Substrate According to Embodiment]

Next, a manufacturing method of the wiring substrate 10 according to embodiment will be described. FIGS. 4-7 are sectional views illustrating a manufacturing process of the wiring substrate 10 according to embodiment.

Figure 4:
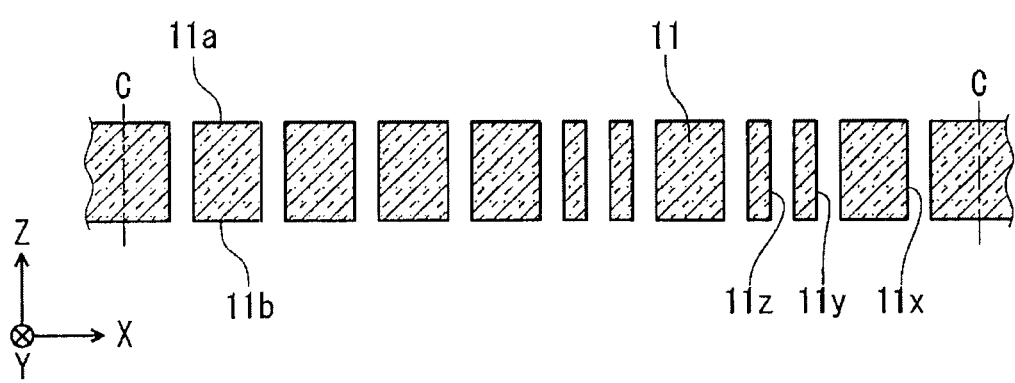
FIG. 4 is a first sectional view illustrating a manufacturing process of the wiring substrate according to the embodiment.

First, in the step shown in FIG. 4, a substrate body 11 is prepared and through-holes 11x, 11y, and 11z are formed through the substrate body 11 so as to reach its surfaces 11a and 11b. For example, the substrate body 11 is a silicon wafer of 6 inches (about 150 mm), 8 inches (about 200 mm), or 12 inches (about 300 mm). For example, the thickness of the silicon wafer is 0.625 (in the case of 6 inches), 0.725 mm (in the case of 8 inches), or 0.775 mm (in the case of 12 inches). However, the silicon wafer may be thinned as appropriate using a backside grinder or the like (e.g., to a thickness of about 200 to 300 μm.) Reference character C indicates positions where the substrate body 11 etc. are cut finally (hereinafter referred to as "cutting positions C").

As shown in FIG. 1, the through-holes 11x and 11y are formed in such a manner that they are comb-shaped in a plan view and that their comb tooth portions are arranged alternately. The through-holes 11z are arranged in such a manner that each of them is disposed between comb tooth portions, opposed to each other at a prescribed interval, of the through-holes 11x and 11y.

For example, the through-holes 11x, 11y, and 11z are formed by forming, on the one surface 11a of the substrate body 11, a resist layer having openings in regions where the through-holes 11x, 11y, and 11z are to be formed and etching the substrate body 11 using the resist layer as a mask. It is preferable to use an anisotropic etching method such as deep reactive ion etching (DRIE) that uses $SF_6$ (sulfur hexafluoride).

For example, the width of the through-holes 11x and 11y is set at several tens to several hundreds of micrometers. For example, the through-holes 11z are formed so as to be circular in a plan view, in which case their diameter is set at about 50 to 100 μm, for example. Alternatively, the through-holes 11z may be formed so as to be rectangular, for example, in a plan view.

Figure 5:
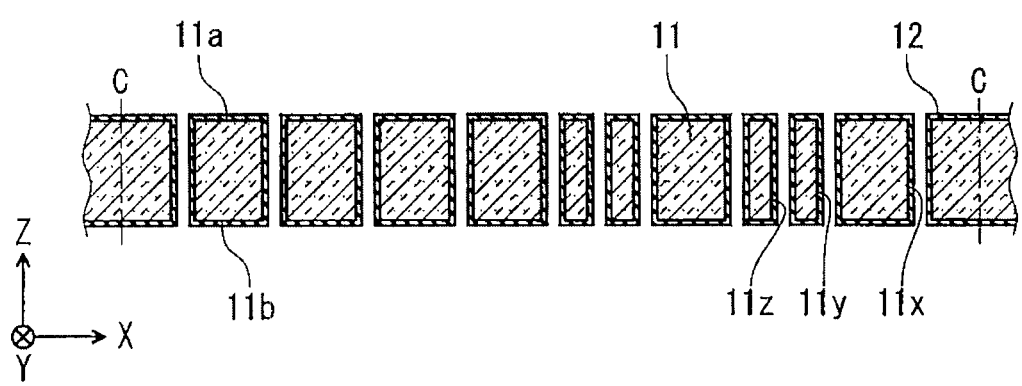
FIG. 5 is a second sectional view illustrating the manufacturing process of the wiring substrate according to the embodiment.

Then, in the step shown in FIG. 5, an insulating film 12 is formed on the surfaces 11a and 11b of the substrate body 11 and the inner side surfaces of the through-holes 11x, 11y, and 11z. For example, the insulating film 12 is a thermal oxidation film ($SiO_2$ film). The insulating film 12 is formed through thermal oxidation by a wet thermal oxidation method in which the temperature of the surface and its vicinity of the substrate body 11 is increased to, for example, 1,000° C. or higher. For example, the thickness of the insulating film 12 is set at about 1 to 2 μm. Alternatively, a film made of silicon dioxide ($SiO_2$), silicon nitride (SiN), polyimide (PI), or the like may be formed as the insulating film 12 by CVD (chemical vapor deposition), for example.

Figure 6:
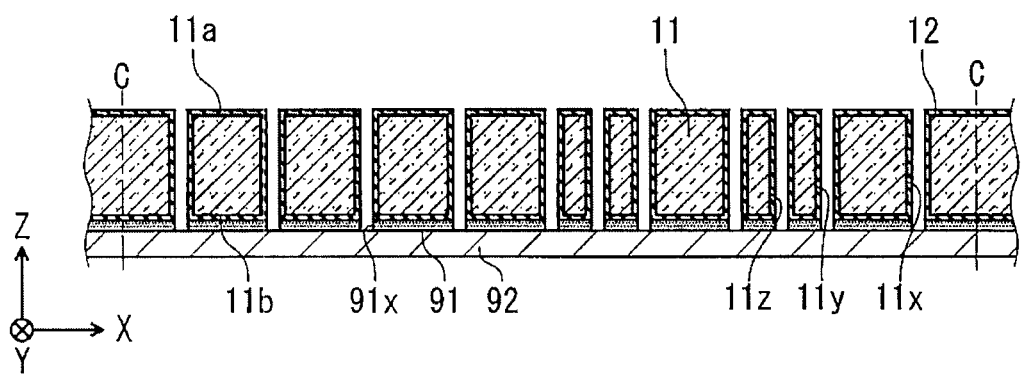
FIG. 6 is a third sectional view illustrating the manufacturing process of the wiring substrate according to the embodiment.

Then, in the step shown in FIG. 6, a metal layer 92 is placed, via a bonding layer 91, on that portion of the insulating film 12 which covers the other surface lib of the substrate body 11. Then, openings 91x are formed through the bonding layer 91 by removing its portions exposed by the through-holes 11x, 11y, and 11z whose inner side surfaces are covered with the insulating film 12, by asking, for example.

As a result, surface portions of the metal film 92 are exposed by the through-holes 11x, 11y, and 11z whose inner side surfaces are covered with the insulating film 12. The metal film 92 is a member to serve as an electricity supply layer informing a GND electrode 13, a power electrode 14, and signal electrodes 15 by electrolytic plating. For example, the metal film 92 is a copper (Cu) plate or foil. The following description will be directed to a case that the metal film 92 is a copper plate.

Figure 7:
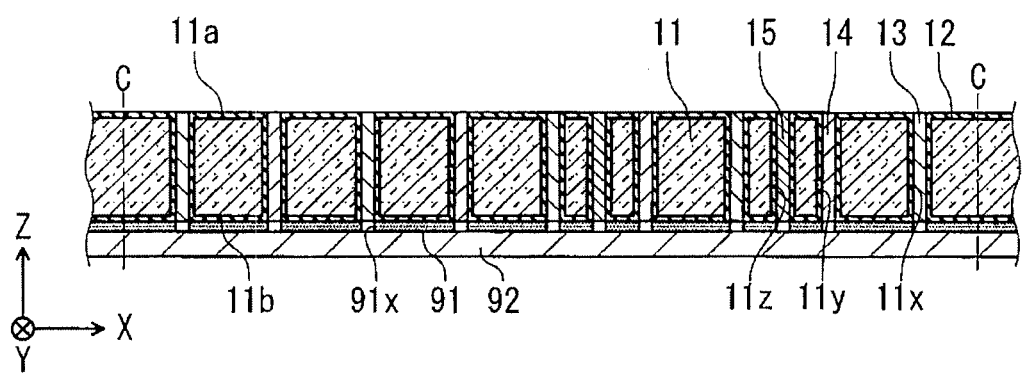
FIG. 7 is a fourth sectional view illustrating the manufacturing process of the wiring substrate according to the embodiment.

Next, in the step shown in FIG. 7, plating films are deposited and grown in the through-holes 11x, 11y, and 11z from the side of the metal layer 92 by electrolytic plating in which the metal layer 92 serves as an electricity supply layer. A GND electrode 13, a power electrode 14, and signal electrodes 15 are formed so that the through-holes 11x, 11y, and 11z (whose inner side surfaces are covered with the insulating film 12) are filled with them, respectively. For example, a metal material containing copper (Cu) as the main component is used as a material of the GND electrode 13, the power electrode 14, and the signal electrodes 15.

For example, the width of the GND electrode 13 is set at several tens to several hundreds of micrometers so as to be equal to the width of the through-hole 11x. For example, the width of the power electrode 14 is set at several tens to several hundreds of micrometers so as to be equal to the width of the through-hole 11y. For example, like the through-holes 11z, the signal electrodes 15 are formed so as to be circular in a plan view, in which case their diameter is set at about 50 to 100 μm, for example.

If necessary, the substrate body 11 may be planarized by polishing it on the side of the one surface 11a by CMP (chemical mechanical polishing), for example. As a result, those surfaces of the GND electrode 13, the power electrode 14, and the signal electrodes 15 which are exposed on the side of the surface 11a of the substrate body 11 can be made approximately flush with that surface of the insulating film 12 which covers the surface 11a of the substrate body 11.

Then, although not shown in any drawing, after the step shown in FIG. 7, the bonding layer 91 and the metal layer 92 are removed and those portions of the GND electrode 13, the power electrode 14, and the signal electrodes 15 which project from the other surface 11b of the substrate body 11 are polished away by CMP, for example. As a result, those surfaces of the GND electrode 13, the power electrode 14, and the signal electrodes 15 which are exposed on the side of the surface 11b of the substrate body 11 can be made approximately flush with the surface of the insulating film 12 which covers the surface 11b of the substrate body 11. Then, the thus-produced structure is cut into individual substrates at the cutting positions C by dicing, for example, whereby wiring substrates 10 as shown in FIGS. 1-3 are completed.

The metal layer 92 which is a copper (Cu) plate can be removed by wet etching which uses an aqueous solution of ferric chloride, cupric chloride, ammonium persulfate, or the like. The bonding layer 91 can be removed by asking, for example.

As described above, the wiring substrate 10 according to the embodiment has the GND electrode 13 which is comb-shaped in a plan view as a result of connection of the flat-plate-like comb tooth portions which penetrate through the substrate body 11 in its thickness direction with the major surfaces of the comb tooth portions perpendicular to the thickness direction of the substrate body 11 and the power electrode 14 which is comb-shaped in a plan view as a result of connection of the flat-plate-like comb tooth portions which penetrate through the substrate body 11 in its thickness direction with the major surfaces of the comb tooth portions perpendicular to the thickness direction of the substrate body 11. The comb tooth portions of the GND electrode 13 and those of the power electrode 14 are arranged alternately. Each signal electrode 15 which penetrates through the substrate body 11 in its thickness direction is disposed at such a position as to be interposed between confronting comb tooth portions of the GND electrode 13 and the power electrode 14.

Since each of the GND electrode 13 and the power electrode 14 has a flat-plate-like shape and penetrates through the substrate body 11 in its thickness direction, a wide conductor area can be secured and hence the resistance of each of the GND electrode 13 and the power electrode 14 can be made low. Since the GND electrode 13 and the power electrode 14 are opposed to each other at a small interval, they can be made more capacitive than inductive. Furthermore, such a GND electrode 13 and power electrode 14 can reduce power source impedance in the wiring substrate 10.

Since each signal electrode 15 is disposed at such a position as to be interposed between confronting, flat-plate-like comb tooth portions of the GND electrode 13 and the power electrode 14, reduction of power source impedance in the wiring substrate 10 and other advantages can be realized without lowering the wiring density in the wiring substrate 10.

Since each signal electrode 15 is interposed between confronting, flat-plate-like comb tooth portions of the GND electrode 13 and the power electrode 14, it can be shielded from external noise. And each signal electrode 15 itself can be prevented from becoming a noise source.

Furthermore, since each signal electrode 15 is interposed between confronting, flat-plate-like comb tooth portions of the GND electrode 13 and the power electrode 14, a transmission line having what is called a strip line structure is realized and hence impedance matching can be attained (e.g., impedance of 50Ω can be realized).

<Modification 1 of Embodiment>

In a first modification of the embodiment, an additional GND electrode and a power electrode are formed so as to surround the GND electrode 13 and the power electrode 14 used in the embodiment. In the first modification of the embodiment, constituent elements having the same ones in the embodiment will not be described in detail.

Figure 8:
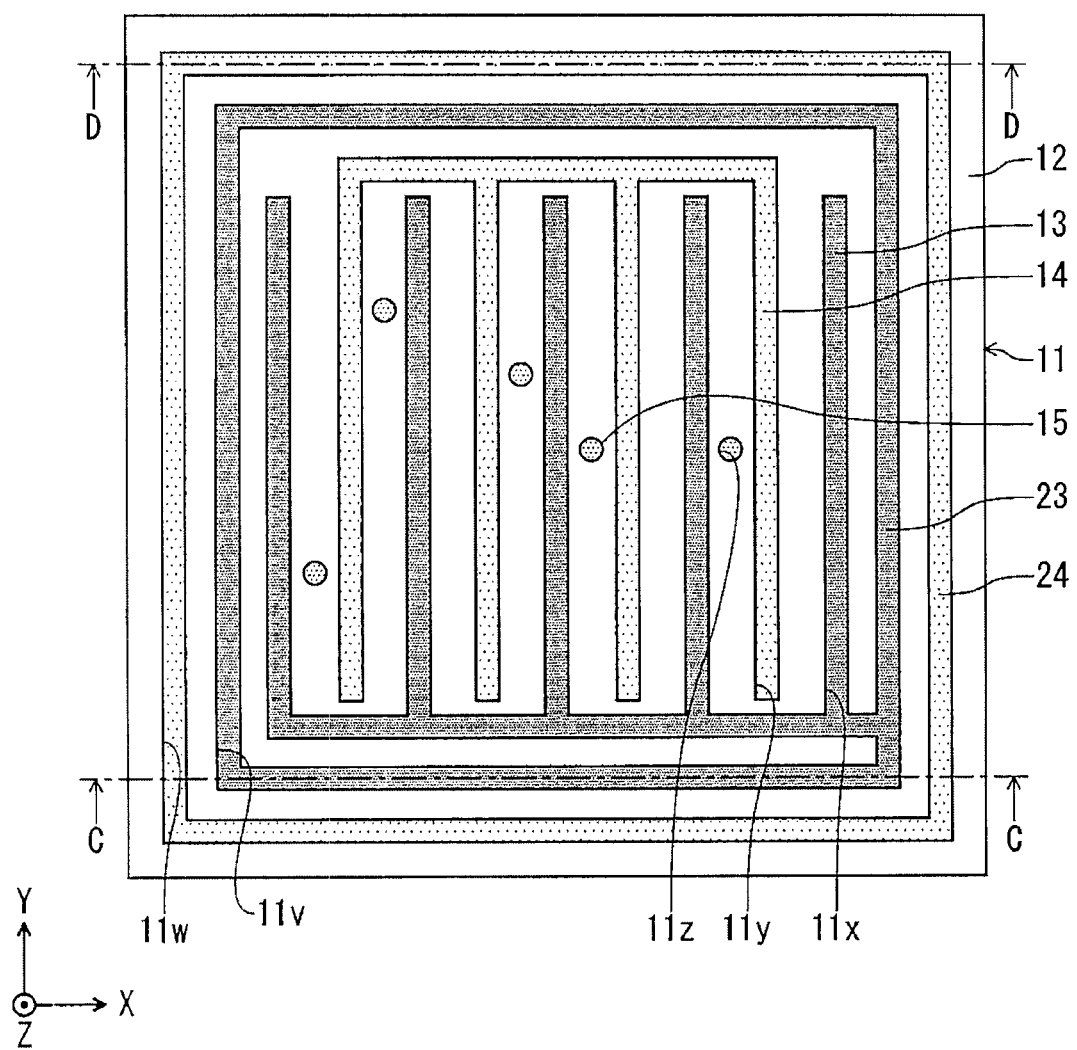
FIG. 8 is a plan view of a wiring substrate according to a first modification of the embodiment.
Figure 9:
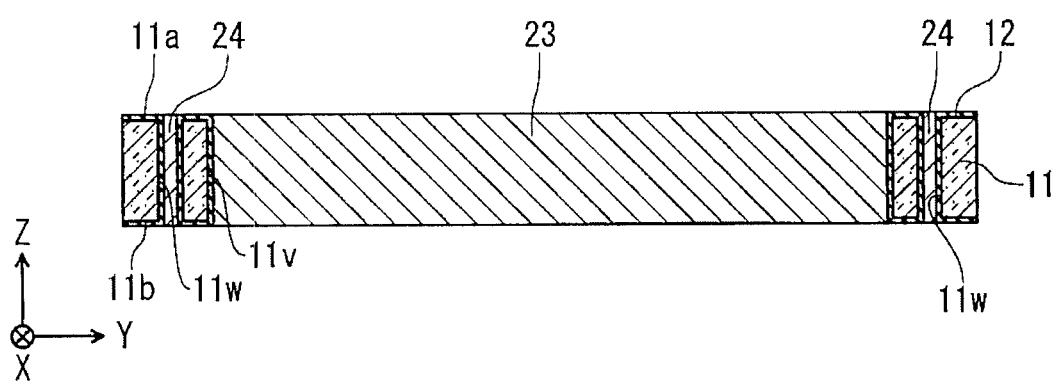
FIG. 9 is a sectional view taken along line C-C in FIG. 8.
Figure 10:
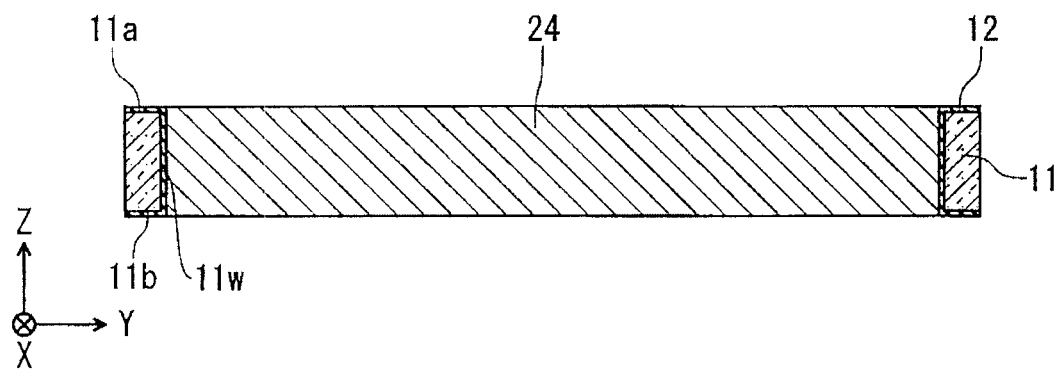
FIG. 10 is a sectional view taken along line D-D in FIG. 8.

FIG. 8 is a plan view of a wiring substrate 20 according to the first modification of the embodiment. FIG. 9 is a sectional view taken along line C-C in FIG. 8. FIG. 10 is a sectional view taken along line D-D in FIG. 8.

As shown in FIGS. 8-10, the wiring substrate 20 is different from the wiring substrate 10 according to the embodiment (see FIGS. 1-3) in that through-holes 11v and 11w and a GND electrode 23 (third electrode) and a power electrode 24 (fourth electrode) are added.

Each of the through-holes 11v and 11w penetrates through the substrate body 11 from its one surface 11a to the other surface 11b. The through-hole 11v is formed for formation of the GND electrode 23 so as to extend in the thickness direction (Z direction) of the substrate body 11. More specifically, the through-hole 11v is formed in frame form so as to surround the through-holes 11x, 11y, and 11z, and communicates with the through-hole 11x at a bottom-right position in FIG. 8. For example, the width of the through-hole 11v is set at several tens to several hundreds of micrometers.

The through-hole 11w is formed for formation of the power electrode 24 so as to extend in the thickness direction (Z direction) of the substrate body 11. More specifically, the through-hole 11w is formed in frame form so as to surround the through-hole 11v. For example, the width of the through-hole 11w is set at several tens to several hundreds of micrometers. The insulating film 12 is also formed on the inner side surfaces of the through-holes 11v and 11w.

The GND electrode 23 is formed so that the through-hole 11v (whose inner side surfaces are covered with the insulating film 12) is filled with it. The GND electrode 23 is formed in frame form so as to surround the GND electrode 13, the power electrode 14, and the signal electrodes 15, and is electrically connected to the GND electrode 13. The GND electrode 23 is what is called a GND plane.

The surface, exposed on the side of the one surface 11a of the substrate body 11, of the GND electrode 23 is approximately flush with the surface of that portion of the insulating film 12 which covers the surface 11a. The surface, exposed on the side of the other surface 11b of the substrate body 11, of the GND electrode 23 is approximately flush with the surface of that portion of the insulating film 12 which covers the surface 11b. For example, the material of the GND electrode 23 is a metal material containing copper (Cu) as the main component. For example, the width of the GND electrode 23 is set at several tens to several hundreds of micrometers so as to be equal to the width of the through-hole 11v.

The power electrode 24 is formed so that the through-hole 11w (whose inner side surfaces are covered with the insulating film 12) is filled with it. The power electrode 24 is formed in frame form so as to surround the GND electrode 23. The power electrode 24 is what is called a power plane. The power electrode 24 can be electrically connected to the power electrode 14 by, for example, a re-wiring layer formed on the substrate body 11.

The surface, exposed on the side of the one surface 11a of the substrate body 11, of the power electrode 24 is approximately flush with the surface of that portion of the insulating film 12 which covers the surface 11a. The surface, exposed on the side of the other surface 11b of the substrate body 11, of the power electrode 24 is approximately flush with the surface of that portion of the insulating film 12 which covers the surface 11b. For example, the material of the power electrode 24 is a metal material containing copper (Cu) as the main component. For example, the width of the power electrode 24 is set at several tens to several hundreds of micrometers so as to be equal to the width of the through-hole 11w.

As described above, in the wiring substrate 20 according to the first modification of the embodiment, the frame-like GND electrode 23 is formed so as to extend in its thickness direction of the substrate body 11 and to surround the GND electrode 13, the power electrode 14, and the signal electrodes 15. And the frame-like power electrode 24 is formed so as to extend in the thickness direction of the substrate body 11 and to surround the GND electrode 23.

With the above measures, the first modification provides, in addition to the advantages of the embodiment, advantages that the effect of shielding the signal electrode 15 from external noise is enhanced and that the probability that the signal electrode 15 itself becomes a noise source can be lowered further.

<Modification 2 of Embodiment>

In a second modification of the embodiment, no through-hole that connects plural long, rectangular-parallelepiped-shaped through-holes which are arranged in the X direction is formed. In the second modification of the embodiment, constituent elements having the same ones in the embodiment will not be described in detail.

Figure 11:
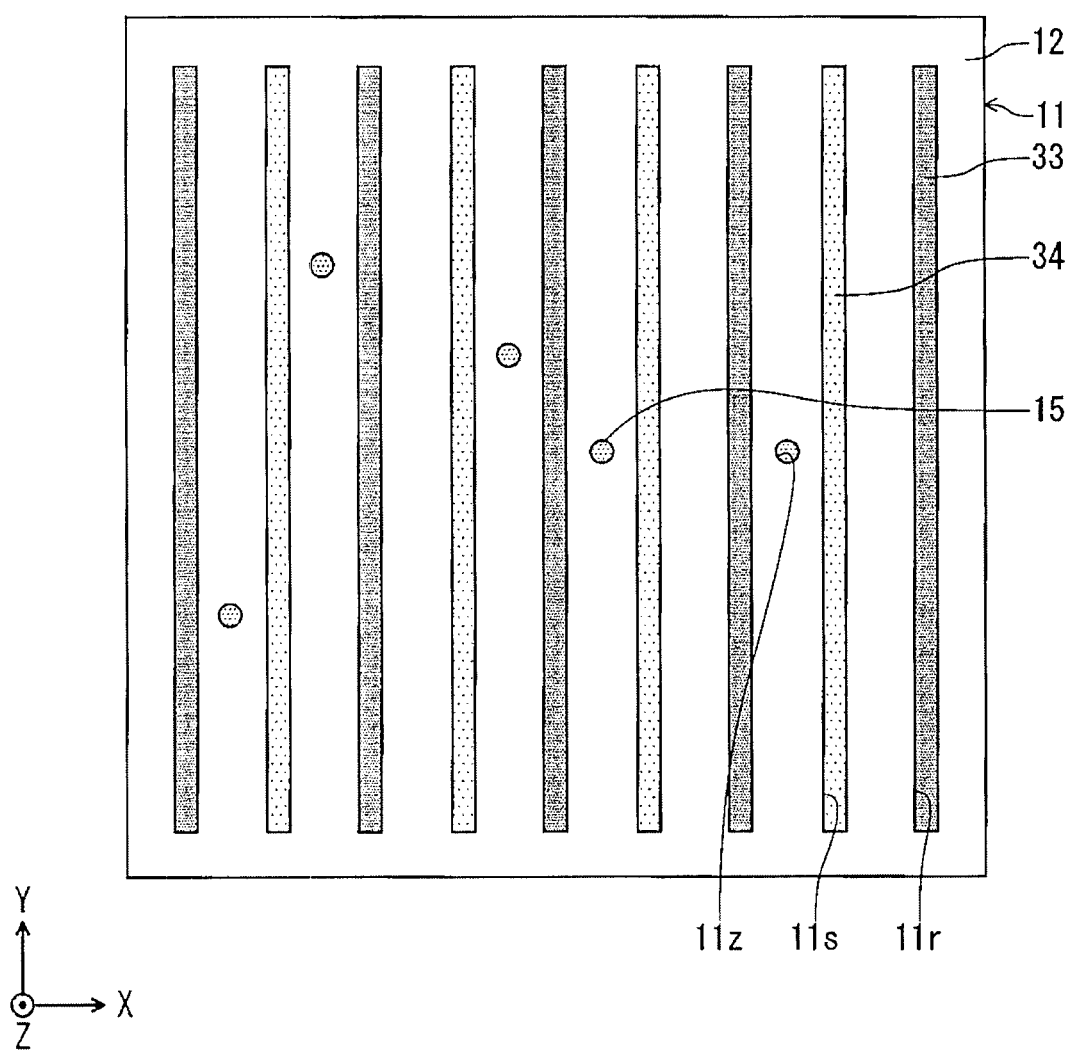
FIG. 11 is a plan view of a wiring substrate according to a second modification of the embodiment.

FIG. 11 is a plan view of a wiring substrate 30 according to the second modification of the embodiment. As shown in FIG. 11, the wiring substrate 30 is different from the wiring substrate 10 according to the embodiment (see FIGS. 1-3) in that the through-hole 11x is replaced by through-holes 11r, the through-hole 11y is replaced by through-holes 11s, the GND electrode 13 is replaced by GND electrodes 33, and the power electrode 14 is replaced by power electrodes 34. A cross-section of the wiring substrate 30 taken by a plane that is parallel with the ZX plane is the same as the cross-section of the wiring substrate 10 taken in the same manner (see FIG. 2).

The through-holes 11r and 11s penetrate through the substrate body 11 from its one surface 11a to the other surface 11b. The through-holes 11r are formed so as to extend in the thickness direction (Z direction) of the substrate body 11 and to have a long, rectangular-parallelepiped shape, and serve for formation of the GND electrodes 33. More specifically, plural (in the example of FIG. 11, five) long, rectangular-parallelepiped-shaped through-holes 11r are arranged in the X direction so as to extend approximately parallel with the two confronting surfaces (i.e., the side surfaces parallel with the YZ plane) of the substrate body 11. For example, the width of each through-hole 11r is set at several tens to several hundreds of micrometers.

The through-holes 11s are formed so as to extend in the thickness direction (Z direction) of the substrate body 11 and to have a long, rectangular-parallelepiped shape, and serve for formation of the power electrodes 34. More specifically, plural (in the example of FIG. 11, four) long, rectangular-parallelepiped-shaped through-holes 11s are arranged in the X direction so as to extend approximately parallel with the two confronting surfaces (i.e., the side surfaces parallel with the YZ plane) of the substrate body 11. For example, the width of each through-hole 11s is set at several tens to several hundreds of micrometers.

The through-holes 11r and the through-holes 11s are arranged alternately. Portions of the insulating film 12 and a portion of the substrate body 11 exist between through-holes 11r and 11s that are adjacent to each other.

The GND electrodes 33 are formed so that the respective through-holes 11r (whose inner side surfaces are covered with the insulating film 12) are filled with them. The GND electrodes 33 are flat-plate-like electrodes which penetrate through the substrate body 11 in its thickness direction with the major surfaces of the GND electrodes 33 perpendicular to the thickness direction of the substrate body 11. The GND electrodes 33 are what is called GND planes. The surfaces, exposed on the side of the one surface 11a of the substrate body 11, of the respective GND electrodes 33 are approximately flush with the surface of that portion of the insulating film 12 which covers the surface 11a. The surfaces, exposed on the side of the other surface 11b of the substrate body 11, of the respective GND electrodes 33 are approximately flush with the surface of that portion of the insulating film 12 which covers the surface 11b.

For example, the material of the GND electrodes 33 is a metal material containing copper (Cu) as the main component. For example, the width of each GND electrode 33 is set at several tens to several hundreds of micrometers so as to be equal to the width of each through-hole 11r.

The power electrodes 34 are formed so that the respective through-holes 11s (whose inner side surfaces are covered with the insulating film 12) are filled with them. The power electrodes 34 are flat-plate-like electrodes which penetrate through the substrate body 11 in its thickness direction with the major surfaces of the power electrodes 34 perpendicular to the thickness direction of the substrate body 11. The power electrodes 34 are what is called power planes. The surfaces, exposed on the side of the one surface 11a of the substrate body 11, of the respective power electrodes 34 are approximately flush with the surface of that portion of the insulating film 12 which covers the surface 11a. The surfaces, exposed on the side of the other surface 11b of the substrate body 11, of the respective power electrodes 34 are approximately flush with the surface of that portion of the insulating film 12 which covers the surface 11b.

For example, the material of the power electrodes 34 is a metal material containing copper (Cu) as the main component. For example, the width of each power electrode 34 is set at several tens to several hundreds of micrometers so as to be equal to the width of each through-hole 11s.

Each of signal electrodes 15 is interposed between a GND electrode 33 and a power electrode 34 that are opposed to each other at a prescribed interval. The GND electrodes 33 can be electrically connected to each other by, for example, a re-wiring layer formed on the substrate body 11. The power electrodes 34 can be electrically connected to each other by, for example, a re-wiring layer formed on the substrate body 11.

As described above, in the wiring substrate 30 according to the second modification of the embodiment, the plural flat-plate-like GND electrodes 33 which penetrate through the substrate body 11 in its thickness direction with the major surfaces of the GND electrodes 33 perpendicular to the thickness direction of the substrate body 11 and the plural flat-plate-like power electrodes 34 which penetrate through the substrate body 11 in its thickness direction with the major surfaces of the power electrodes 34 perpendicular to the thickness direction of the substrate body 11 are arranged alternately. Each of the signal electrodes 15 is interposed between a GND electrode 33 and a power electrode 34. Even with this configuration, the second modification provides the same advantages as the embodiment.

<Modification 3 of Embodiment>

In a third modification of the embodiment, insulating layers and a wiring layer are provided on both surfaces of the substrate body. In the third modification of the embodiment, constituent elements having the same ones in the embodiment will not be described in detail.

Figure 12:
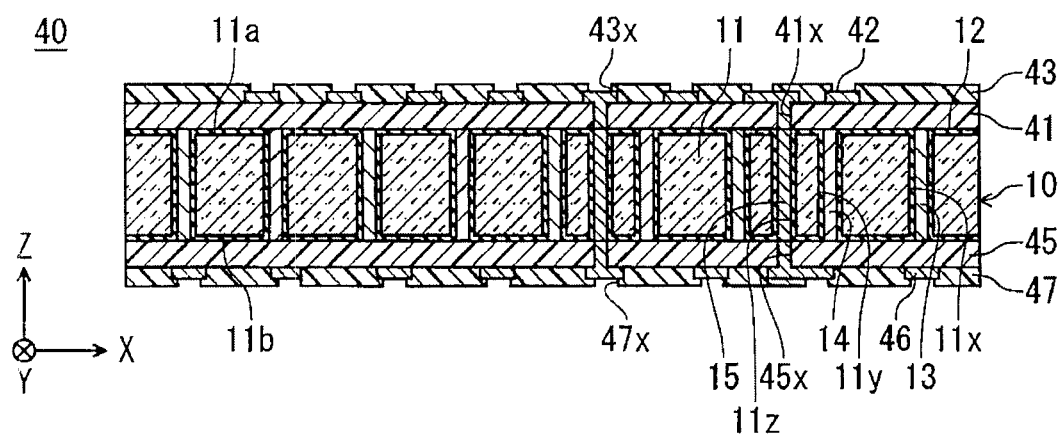
FIG. 12 is a sectional view of a wiring substrate according to a third modification of the embodiment.

FIG. 12 is a sectional view of a wiring substrate 40 according to the third modification of the embodiment. As shown in FIG. 12, the wiring substrate 40 is configured in such a manner that insulating layers and a wiring layer are provided on both surfaces of the substrate body 11 in the wiring substrate 10 according to the embodiment. Alternatively, insulating layers and a wiring layer are provided on both surfaces of the substrate body 11 in the wiring substrate 20 according to the first modification or the wiring substrate 30 according to the second modification.

In the wiring substrate 40, an insulating layer 41 is formed on the one surface 11a of the substrate body 11 via the portion of the insulating film 12. For example, the material of the insulating layer 41 is an epoxy or polyimide insulative resin. For example, the thickness of the insulating layer 41 is set at about 15 to 25 μm.

A wiring layer 42 (what is called a re-wiring layer) is formed on the insulating layer 41. The wiring layer 42 includes via lines with which respective via holes 41x are filled which penetrate through the insulating layer 41 and expose the one end faces of the respective signal electrodes 15 and wiring patterns formed on the insulating layer 41. The wiring patterns are patterned so as to have prescribed plan shapes. The via holes 41x are through holes that are open on both of the insulating layer 43 side and the substrate body 11 side. The via lines are formed in the respective via holes 41x.

The wiring layer 42 is electrically connected to the signal electrodes 15 whose top end faces are exposed by the respective via holes 41x. For example, the material of the wiring layer 42 is a metal material containing copper (Cu) as the main component. For example, the thickness of the wiring patterns of the wiring layer 42 is set at about 10 to 20 μm. The wiring layer 42 may be electrically connected to the GND electrode 13 or the power electrode 14.

An insulating layer 43 is formed on the insulating layer 41 so as to cover the wiring layer 42. The insulating layer 43 is a solder resist layer. The insulating layer 43 has openings 43x which expose respective portions of the wiring layer 42. For example, the material of the insulating layer 43 is an epoxy or acrylic photosensitive resin composition. For example, the thickness of the insulating layer 43 is set at about 15 to 25 μm.

Those portions of the wiring layer 42 which are exposed by the respective openings 43x function as electrode pads to be electrically connected to a semiconductor chip (not shown). In the following, these portions of the wiring layer 42 may be referred to as "electrode pads 42."

If necessary, for example, metal layers may be formed on the respective electrode pads 42 by electroless plating. Examples of each metal layer are an Au layer, an Ni/Au layer (i.e., a metal layer formed by laying an Ni layer and an Au layer in this order), and an Ni/Pd/Au layer (i.e., a metal layer formed by laying an Ni layer, a Pd layer, and an Au layer in this order).

External connection terminals such as solder balls, lead pins, or copper pillar bumps may further be formed on the respective electrode pads 42. The external connection terminals serve as terminals for electrical connection to a semiconductor chip (not shown). The electrode pads 42 themselves may be used as external connection terminals. For example, each electrode pad 42 has a circular plan shape and a diameter of about 40 to 120 μm. For example, the pitch of the electrode pads 42 is set at about 100 to 200 μm.

Likewise, an insulating layer 45, a wiring layer 46, and an insulating layer 47 are provided in this order on the other surface 11b of the substrate body 11 via the insulating layer 12. The wiring layer 46 is electrically connected to the signal electrodes 15 through respective via holes 45x. The wiring layer 46 may be electrically connected the GND electrode 13 or the power electrode 14. The insulating layer 45, the wiring layer 46, and the insulating layer 47 have the same structures as the insulating layer 41, the wiring layer 42, and the insulating layer 43, respectively, and hence will not be described in detail.

Those portions of the wiring layer 46 which are exposed by respective openings 47x function as electrode pads to be electrically connected to another wiring substrate (e.g., buildup substrate) or such a board as a mother board (not shown). In the following, these portions of the wiring layer 46 maybe referred to as "electrode pads 46."

If necessary, for example, metal layers may be formed on the respective electrode pads 46. Examples of each metal layer are an Au layer, an Ni/Au layer (i.e., a metal layer formed by laying an Ni layer and an Au layer in this order), and an Ni/Pd/Au layer (i.e., a metal layer formed by laying an Ni layer, a Pd layer, and an Au layer in this order).

External connection terminals such as solder balls or lead pins may further be formed on the respective electrode pads 46. The external connection terminals serve as terminals for electrical connection to another wiring substrate or such a board as a mother board (not shown). The electrode pads 46 themselves may be used as external connection terminals.

For example, each electrode pad 46 has a circular plan shape and a diameter of about 200 to 1,000 μm. That is, the diameter of the electrode pads 46 which are to be electrically connected to another wiring substrate or such a board as a mother board is set larger than the diameter of the electrode pads 42 which are to be electrically connected to a semiconductor chip (not shown). For example, the pitch of the electrode pads 46 is set at about 500 to 1,200 μm. That is, the pitch of the electrode pads 46 which are to be electrically connected to another wiring substrate or such a board as a mother board is set larger than the diameter of the electrode pads 42 which are to be electrically connected to a semiconductor chip.

As described above, insulating layers and a wiring layer may be provided on both surfaces 11a and 11b of a substrate body 11.

<Example in Which Semiconductor Chips are Mounted>

Figure 13:
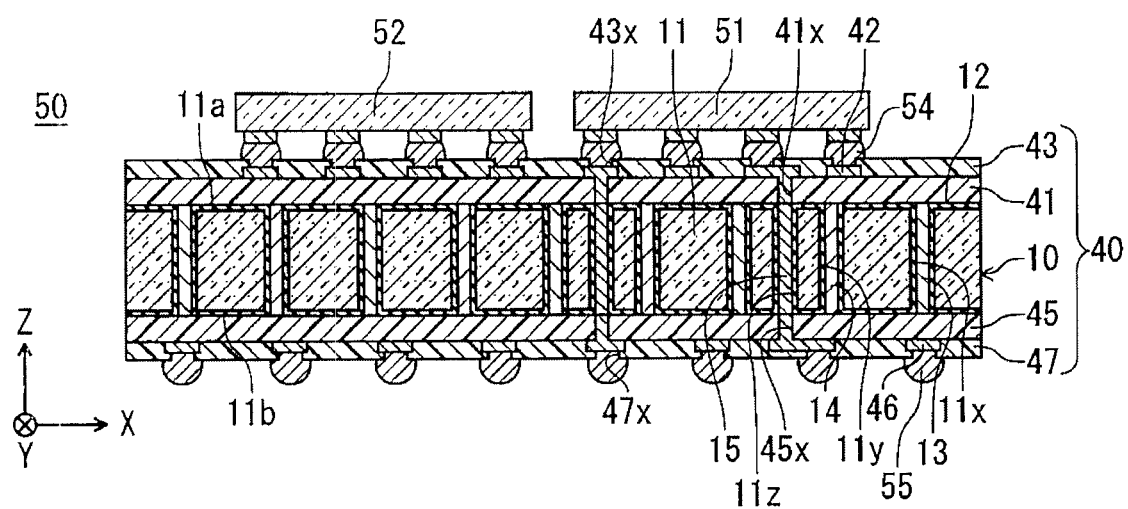
FIG. 13 is a sectional view of a semiconductor package in which semiconductor chips are mounted on the wiring substrate according to the third modification of the embodiment.

Next, an example semiconductor package in which semiconductor chips are mounted on the wiring substrate 40 will be described. FIG. 13 is a sectional view of a semiconductor package 50 in which semiconductor chips are mounted on the wiring substrate 40 according to the third modification of the embodiment. As shown in FIG. 13, the semiconductor package 50 is configured in such a manner that two semiconductor chips 51 and 52 are mounted on the side of the one surface 11a of the substrate body 11 of the wiring substrate 40.

The electrode pads 42 of the wiring substrate 40 are connected to the semiconductor chips 51 and 52 via respective joining portions 54. The spaces between the wiring substrate 40 and the semiconductor chips 51 and 52 may be filled with underfill resin. Joining portions 55 are formed on the respective electrode pads 46 of the wiring substrate 40. The joining portions 55 are portions to be electrically connected to another wiring substrate or such a board as a mother board (not shown). The joining portions 54 and 55 maybe solder balls or the like. Example materials of the solder balls are an alloy containing Pb, an alloy of Sn and Cu, an alloy of Sn and Ag, and an alloy of Sn, Ag, and Cu.

In this manner, a semiconductor package is realized by mounting semiconductor chips on a wiring substrate. The number of semiconductor chips to be mounted on a wiring substrate may be one or a number that is larger than or equal to 3. Where plural semiconductor chips are mounted on a wiring substrate, they may be either ones having the same function or ones having different functions.

Although the preferred embodiment and its modifications have been described, the invention is not limited to them. Various change and replacements may be made in the above embodiment and modifications without departing from the scope as defined by the claims.

What is claimed is:

1. A wiring substrate comprising:
a substrate body made of an inorganic material;
a first electrode portion, having a flat-plate shape that extends along a first direction parallel to one side of the substrate body in a plan view, the first electrode portion penetrating through the substrate body in a thickness direction of the substrate body;
a second electrode portion having a flat-plate shape that extends along the first direction in the plan view, the second electrode portion penetrating through the substrate body in the thickness direction and facing the first electrode portion at a prescribed interval;
a first signal electrode, which is provided between the first electrode portion and the second electrode portion and penetrates through the substrate body in the thickness direction;
a third electrode, having a flat-plate shape, which is provided so as to completely surround the first electrode portion and the second electrode portion in the plan view and penetrates through the substrate body in the thickness direction; and
a fourth electrode, having a flat-plate shape, which is provided so as to completely surround the third electrode in the plan view and penetrates through the substrate body in the thickness direction,
wherein one of the first electrode portion and the second electrode portion is a ground electrode and the other is a power electrode.

2. The wiring substrate according to claim 1, wherein:
the first electrode portion is electrically connected to the third electrode; and
the second electrode portion is electrically connected to the fourth electrode.

3. The wiring substrate according to claim 1, wherein:
end surfaces, exposed on a first surface of the substrate body, of the first electrode portion, the second electrode portion and the first signal electrode are flush with the first surface of the substrate body; and
end surfaces, exposed on a second surface of the substrate body, of the first electrode portion, the second electrode portion and the first signal electrode are flush with the second surface of the substrate body.

4. The wiring substrate according to claim 3, further comprising
an insulating layer and a wiring layer which are provided on the first surface of the substrate body, the wiring layer being electrically connected to the first signal electrode through a via-hole formed through the insulating layer.

5. The wiring substrate according to claim 1, wherein a portion of the substrate body is interposed between the first electrode portion and the second electrode portion, and the first signal electrode is embedded in said portion of the substrate body that is interposed between the first electrode portion and the second electrode portion, such that the first signal electrode is spaced from both the first electrode portion and the second electrode portion, with the substrate body interposed between the first signal electrode and the first electrode portion and the second electrode portion.

* * * * *